United States Patent
Shimoishizaka et al.

(10) Patent No.: US 7,582,968 B2
(45) Date of Patent: Sep. 1, 2009

(54) WIRING BOARD WITH A PROTECTIVE FILM GREATER IN HEIGHTS THAN BUMPS

(75) Inventors: Nozomi Shimoishizaka, Kyoto (JP); Kouichi Nagao, Kyoto (JP); Hiroyuki Imamura, Osaka (JP)

(73) Assignee: Panasonic Corporation, Osaka (JP)

( * ) Notice: Subject to any disclaimer, the term of this patent is extended or adjusted under 35 U.S.C. 154(b) by 126 days.

(21) Appl. No.: 11/558,632

(22) Filed: Nov. 10, 2006

(65) Prior Publication Data

US 2007/0120235 A1     May 31, 2007

(30) Foreign Application Priority Data

Nov. 29, 2005   (JP)   ............... 2005-344277

(51) Int. Cl.
*H01L 23/48*   (2006.01)
*H05K 7/00*   (2006.01)

(52) U.S. Cl. .............. 257/738; 257/779; 257/786; 257/787; 257/E23.021; 257/E23.069; 361/760; 361/772; 361/777

(58) Field of Classification Search .............. None
See application file for complete search history.

(56) References Cited

U.S. PATENT DOCUMENTS 6,281,450 B1 *  8/2001  Urasaki et al. .............. 174/261
6,687,985 B2 *  2/2004  Sakamoto et al. .......... 29/830
7,514,802 B2 *  4/2009  Tetani et al. ................ 257/797

FOREIGN PATENT DOCUMENTS

JP       60084844 A   *   5/1985
JP       2003-243455       8/2003

* cited by examiner

*Primary Examiner*—Alonzo Chambliss
(74) *Attorney, Agent, or Firm*—Hamre, Schumann, Mueller & Larson, P.C.

(57) ABSTRACT

A wiring board according to the present invention includes: an insulating base 22; a plurality of first conductor wirings 23a aligned in an inner region on the insulating base; bumps 24 formed on the respective first conductor wirings; and a protective film 25a that is formed on the insulating base so as to cover the first conductor wirings and has an opening region through which the bumps are exposed. The height of at least part of a surface of the protective film from a surface of the insulating base is greater than the height of the bumps from the surface of the insulating base. With this configuration, it is possible to decrease the thickness in the state where a protective tape is placed on the wiring board to protect bumps, thereby increasing the length of the wiring board that can be held by a reel for supplying the wiring board.

6 Claims, 10 Drawing Sheets

WIRING BOARD WITH A PROTECTIVE FILM GREATER IN HEIGHTS THAN BUMPS

BACKGROUND OF THE INVENTION

1. Field of the Invention

The present invention relates to a wiring board on which bumps are formed and a method for manufacturing the same, and also relates to a semiconductor device using the wiring board.

2. Description of Related Art

Conventionally, a method for manufacturing a semiconductor device has been known in which a semiconductor element is face-down mounted on a wiring board provided with bumps and then electrode pads on the semiconductor element are bonded to the bumps on the wiring board using a TAB (Tape Automated Bonding) method commonly used for the manufacture of semiconductor devices for liquid crystal etc. (see JP 2003-243455 A, for example).

Hereinafter, a conventional wiring board provided with bumps, a semiconductor device using such a wiring board, and a method for manufacturing such a semiconductor device will be described with reference to the drawings. FIG. 12 is a plan view showing a conventional wiring board 1, and FIG. 13 is a sectional view taken along the line A-A' in FIG. 12.

In FIGS. 12 and 13, reference numeral 2 denotes an insulating base, and reference numeral 3a denotes conductor wirings formed on a surface of the insulating base 2. A bump 4 is formed on a leading end portion of each conductor wiring 3a. In regions on both sides of the conductor wirings 3a, dummy conductor wirings 3b, each having the same structure as the conductor wiring 3a, are provided. The bumps 4 are not formed on the dummy conductor wirings 3b. A protective film 5 for protecting the conductor wirings 3a has an opening provided at a region around the bumps 4, thereby exposing the bumps 4. At both end portions of the insulating base 2, the protective film 5 covers the dummy conductor wirings 3b. Furthermore, second conductor wirings 6 are formed along respective side edges of the insulating base 2. The second conductor wirings 6 are used to supply electricity to the conductor wirings 3a when forming the bumps 4 by electroplating.

FIG. 14 is a sectional view showing a semiconductor device obtained by face-down mounting a semiconductor element 7 on the conventional wiring board 1. Electrode pads 7a are formed on the semiconductor element 7 (on the lower surface in FIG. 14), and the electrode pads 7a are bonded to the bumps 4 of the wiring board 1.

In the wiring board to be used for packaging according to the TAB method, the insulating base etc. are formed of a flexible material or formed so as to have flexibility, and the steps of supplying the wiring board, mounting the semiconductor element on the wiring board, carrying out inspection after the semiconductor element has been mounted, etc. are performed continuously by a reel-to-reel method. In order to impart flexibility to the wiring board, a flexible tape formed of PI (Polyimide) or the like and having a thickness of about 40 μm is used as the insulating base 2. The conductor wirings 3a on the insulating base 2 are formed by patterning an about 8 μm thick Cu foil through etching. The bumps 4 are formed on the respective conductor wirings 3a so as to have a thickness of about 10 μm by copper electroplating. The protective film 5 is formed by printing an about 10 μm thick epoxy resin or PI resin in a desired pattern and then curing the resin. The surfaces of the conductor wirings 3a and the bumps 4 are plated with Au, Sn, or the like for bonding and protection against corrosion.

FIG. 15 is a side view schematically showing an apparatus used for mounting the semiconductor element 7 on the conventional wiring board 1 by the TAB method. In FIG. 15, the wiring board 1 and the semiconductor element 7 are the same as those shown in FIGS. 12 to 14. The wiring board 1 is wound around a first reel 9 to form a winding body in which the wiring board 1 and a first protective tape 8 are layered alternatively. The wiring board 1 is supplied in the arrow direction by unwinding the winding body. The first protective tape 8 serves to protect the conductor wirings 3a and the bumps 4. The first protective tape 8 that is unwound from the first reel 9 when supplying the wiring board 1 is wound up and held by a second reel 10.

The wiring board 1 supplied passes between a mounting head 11 and a mounting stage 12. The rear surface of the semiconductor element 7 is attached to the head 11 so that the principal plane of the semiconductor element 7 faces the surface of the wiring board 1. In this state, the semiconductor element 7 and the wiring board 1 are pressed against each other while applying pressure and heat thereto. Thus, the bumps 4 on the wiring board 1 and the electrode pads 7a on the semiconductor element 7 are bonded to each other, whereby the semiconductor element 7 is face-down mounted on the wiring board 1.

A second protective tape 13 is supplied from a third reel 14 and is used to protect the wiring board 1 on which the semiconductor element 7 has been face-down mounted. The wiring board 1 on which the semiconductor element 7 has been mounted is wound up by a fourth reel 15 with the second protective tape 13 being placed on the wiring board 1 and is held by the fourth reel 15 in the state where the wiring board 1 and the second protective tape 13 are layered alternatively. Reference numeral 16 denotes feed rollers for feeding the wiring board 1. Note here that arrows shown in FIG. 15 indicate the directions in which the wiring board 1 and the first and second protective tapes 8 and 13 are moved and the direction in which the first, second, third, and fourth reels 9, 10, 14, and 15 are rotated.

FIG. 16 is a perspective view schematically showing the wiring board-winding body 9A wound around the first reel 9 for supplying the wiring board 1, which is shown in FIG. 15. FIG. 16 shows the state where the wiring board 1 and the first protective tape 8 are wound around the first reel 9 such that the wiring board 1 and the first protective tape 8 are layered alternately.

FIG. 17 is a side view showing a portion of the winding body shown in FIG. 16, in which the wiring board 1 and the first protective tape 8 are layered alternately, and FIG. 18 is a sectional view taken along the line B-B' in FIG. 16.

In FIGS. 17 and 18, reference numeral 17 denotes embossed portions formed along the edges of respective end portions of the first protective tape 8. By the embossed portions 17, a space is formed between the bumps 4 and the first protective tape 8. Accordingly, the first protective tape 8 does not contact the bumps 4, so that the bumps 4 can be prevented from being damaged or contaminated due to contact with the first protective tape 8. Therefore, it is possible to prevent the occurrence of poor bonding between the electrode pads 7a and the bumps 4 when mounting the semiconductor element 7 on the wiring board 1.

Since the first protective tape 8 needs to have flexibility and mechanical strength, a tape formed of a material such as PEI (Polyetherimide), PET (Polyester), or PI and having a thickness of 125 μm to 250 μm is used as the first protective tape 8.

The embossed portions 17 of the first protective tape 8 generally are formed by secondary processing the end portions of the first protective tape 8 as shown in FIG. 17 with the use of a die. The embossed portions 17 are formed with a pitch of 5 mm to 15 mm so as to have a height of 1 mm to 3 mm, considering the thickness of the first protective tape 8, the amount of plastic deformation at the time of the processing with the die, and the return amount from the plastic deformation after the processing with the die, and the strength of the embossed portions.

As an alternative method of obtaining the same effect as that produced by the embossed portions 17 of the first protective tape 8, a method has been used in which, as shown in FIGS. 19 and 20, openings 18 are provided in respective end portions of the first protective tape 8 and spacers 19, which are protrusions, are inserted into the openings.

Considering the deterioration in strength of the first protective tape 8 caused by the formation of the openings 18 and the mechanical strength of the spacers 19, the spacers 19 are formed with a pitch of about 10 mm so as to have a height of about 3 mm. As a material of the spacers 19, LCP (Liquid Crystal Polymer) or the like is used in view of its mechanical strength, ease of processing, etc.

According to the above-described conventional manufacturing method, it is necessary to provide the embossed portions 17 or the spacers 19 along the edges of the respective end portions of the first protective tape 8 in order to prevent the bumps 4 from being damaged or contaminated by the contact with the first protective tape 8 when winding the wiring board 1 and the first protective tape 8 around the first reel 9 such that the wiring board 1 and the first protective tape 8 are layered alternately.

However, as described above, the embossed portions 17 and the spacers 19 formed on the first protective tape 8 have a height of 1 mm to 3 mm, which is large relative to the thickness 40 μm of the wiring board 1. Thus, when the wiring board 1 and the first protective tape 8 are wound around the first reel 9 such that the wiring board 1 and the first protective tape 8 are layered alternately, the first reel 9 can hold only a short length of the wiring board 1. This poses a problem in that the frequency of replacing the first reel 9 that supplies the wiring board 1 in the manufacturing process according to the TAB increases, resulting in decreased productivity.

Moreover, the secondary processing for providing the embossed portions 17 or the spacers 19 in the respective end portions of the first protective tape 8 increases the cost required for processing the first protective tape 8.

SUMMARY OF THE INVENTION

The present invention has been made in order to solve the above-described problems in the prior art, and it is an object of the present invention to provide a wiring board with which it is possible to decrease the thickness in the state where a protective tape is placed on the wiring board to protect bumps so as to increase the length of the wiring board that can be held by a reel for supplying the wiring board, whereby the frequency of replacing the reel is decreased, resulting in improved productivity in the manufacturing process according to a TAB method.

It is another object of the present invention to provide a wiring board with which the necessity of performing secondary processing for providing embossed portions or spacers in respective end portions of a protective tape is eliminated, thus reducing the cost required for processing the protective tape.

A wiring board according to the present invention includes: an insulating base; a plurality of first conductor wirings aligned in an inner region on the insulating base; bumps formed on the respective first conductor wirings; and a protective film that is formed on the insulating base so as to cover the first conductor wirings and has an opening region through which the bumps are exposed. In order to solve the above-described problem, a height of at least part of a surface of the protective film from a surface of the insulating base is greater than a height of the bumps from the surface of the insulating base.

A method for manufacturing a wiring board according to the present invention includes the steps of: providing an insulating base in which first conductor wirings are provided in an inner region and second conductor wirings are provided on respective side edge portions; forming bumps on the respective first conductor wirings; and covering the first conductor wirings on the insulating base with a protective film that has an opening region through which the bumps are exposed. In this method, in the step of forming the bumps, supporting portions are formed on the respective second conductor wirings at the same time as the formation of the bumps by conducting electroplating, and the protective film covers the first conductor wirings, the second conductor wirings, and the supporting portions.

DETAILED DESCRIPTION OF THE INVENTION

Figure 1:
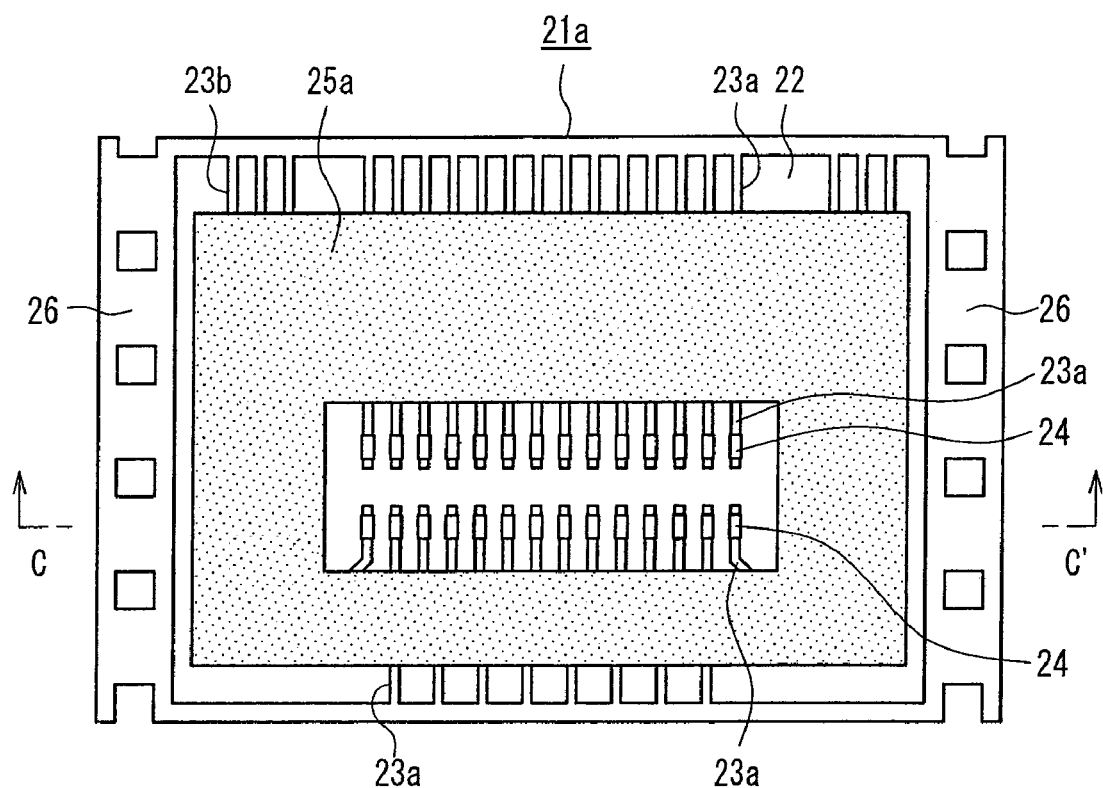
FIG. 1 is a plan view showing a wiring board according to a first embodiment of the present invention.

According to the wiring board of the present invention, the height of at least part of the surface of the protective film from the surface of the insulating base is greater than the height of the bumps from the surface of the insulating base. Thus, when the protective tape is placed on the wiring board, the protective tape is supported by the protective film formed so as to be higher than the bumps. Accordingly, even if the protective tape does not have embossed portions or spacers, the protective tape does not contact the bumps. This prevents the bumps 24 from being damaged or contaminated.

Moreover, when the wiring board and the protective tape are wound such that the wiring board and the protective tape are layered alternately, they are layered with the protective tape being in direct contact with the surface of the protective film. Therefore, as compared with the case where the wiring board and the protective tape having embossed portions or spacers in its respective end portions are layered alternately, a larger number of layers of the wiring board can be contained in the winding body of the same height.

The above-described wiring board according to the present invention may be configured so that it further includes: second conductor wirings formed on respective side edge portions of the insulating base; and supporting portions formed on the respective second conductor wirings. In this wiring board, the protective film covers the first conductor wirings and the supporting portions, and a height of at least part of a surface of the protective film on each of the supporting portions from the surface of the insulating base is greater than the height of the bumps from the surface of the insulating base.

With this configuration, it is possible to obtain the same effect as that produced by the wiring board with the above-described configuration. Besides, since the protective film is formed on the supporting portions, it is possible to secure a height sufficient for reliably supporting the protective tape even when the protective film is thin, and to reduce the amount of the material of the protective film to be used.

It is preferable that the supporting portions are formed of the same material as the bumps.

Furthermore, it is preferable that each of the supporting portions is composed of a plurality of regions that are separated from each other in a longitudinal direction of the second conductor wiring.

With this configuration, it is possible to obtain the same effect as that produced by the wiring board with the above-described configuration. Besides, since each of the supporting portions is composed of a plurality of regions, the flexibility of the wiring board is improved, so that the feeding of the wiring board can be controlled easily when assembling a semiconductor device according to the TAB method.

Also, it is possible to provide a wiring board-winding body obtained by winding the wiring board having any one of the above-described configurations with a protecting sheet being placed on the wiring board. In this wiring board-winding body, the protecting sheet is in contact with the protective film formed on a surface of the wiring board at portions of the protective film where a height from the insulating base is greatest, and the wiring board and the protecting sheet are layered alternately with a rear surface of the protecting sheet not being in contact with the bumps.

With this configuration, the wiring board and the protective tape can be layered alternately with the protective tape being in direct contact with the surface of the protective film. Therefore, as compared with the case where the wiring board and the protective tape having supporting portions in its respective end portions are layered alternately, a larger number of layers of the wiring board can be contained in the winding body of the same height.

According to the method for manufacturing a wiring board of the present invention, in the step of forming the bumps, supporting portions are formed on the respective second conductor wirings at the same time as the formation of the bumps by conducting electroplating, and the protective film covers not only the first conductor wirings but also the second conductor wirings and the supporting portions. Thus, the bumps and the supporting portions are formed so as to have the same height, and the height of a surface of the protective film on each of the supporting portions from the insulating base always can be made greater than the height of the bumps from the insulating base by the thickness of the protective film.

Also, it is possible to provide a semiconductor device including: the wiring board with any one of the above described configurations; and a semiconductor chip mounted on the wiring board, wherein electrode pads of the semiconductor chip are connected electrically to the conductor wirings.

Hereinafter, the present invention will be described by way of illustrative embodiments with reference to the drawings.

FIRST EMBODIMENT

Figure 2:
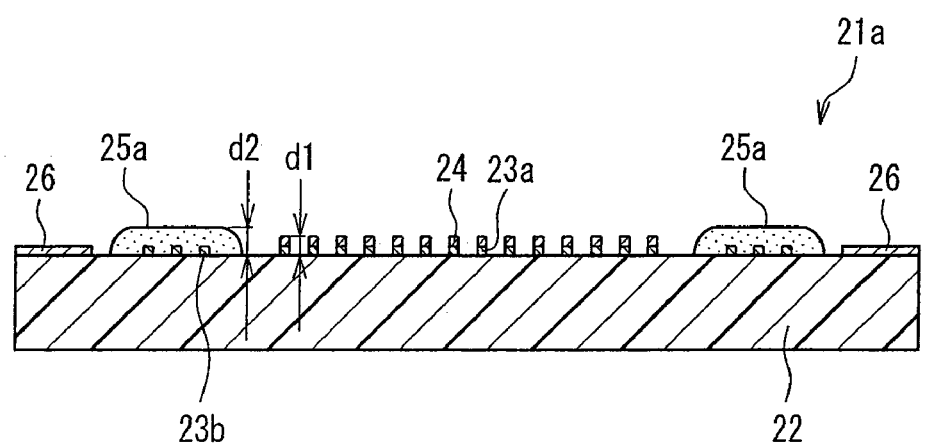
FIG. 2 is a sectional view showing the cross section of the wiring board taken along the line C-C' in FIG. 1.

FIG. 1 is a plan view showing a wiring board 21a according to a first embodiment of the present invention, and FIG. 2 is a sectional view taken along the line C-C' in FIG. 1.

Figure 12:
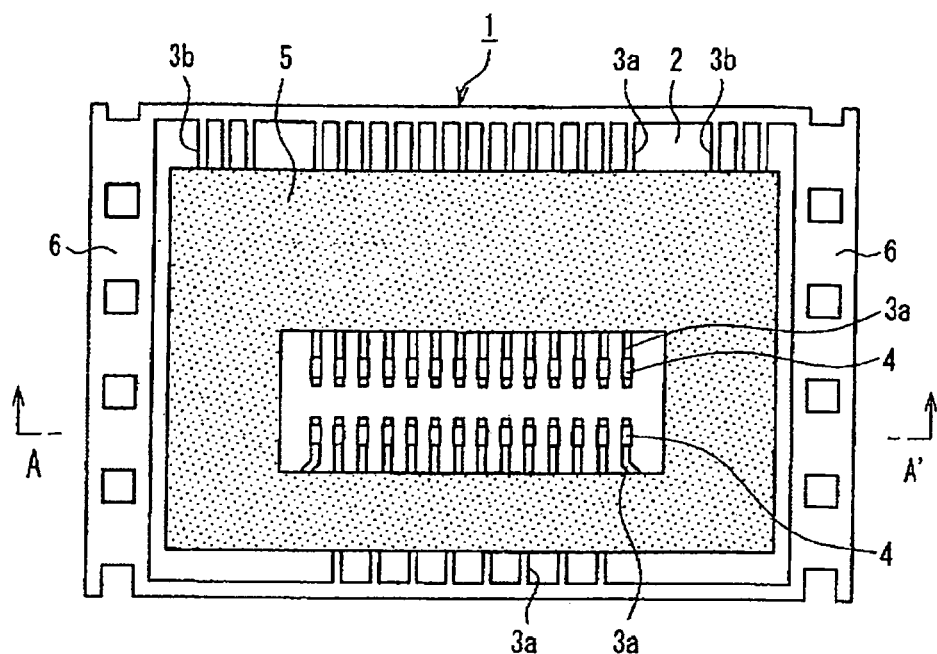
FIG. 12 is a plan view showing an example of a conventional wiring board.
Figure 13:
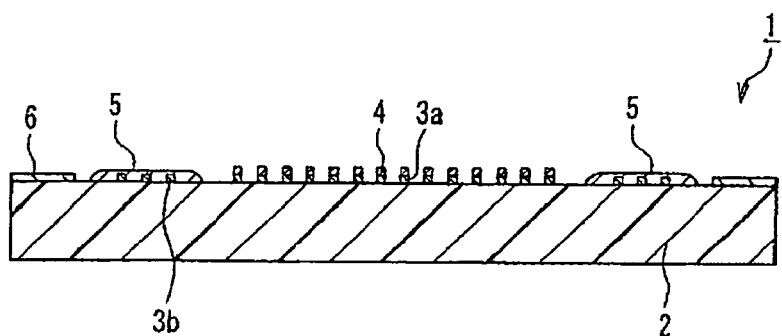
FIG. 13 is a sectional view showing the cross section of the conventional wiring board taken along the line A-A' in FIG. 12.
Figure 14:
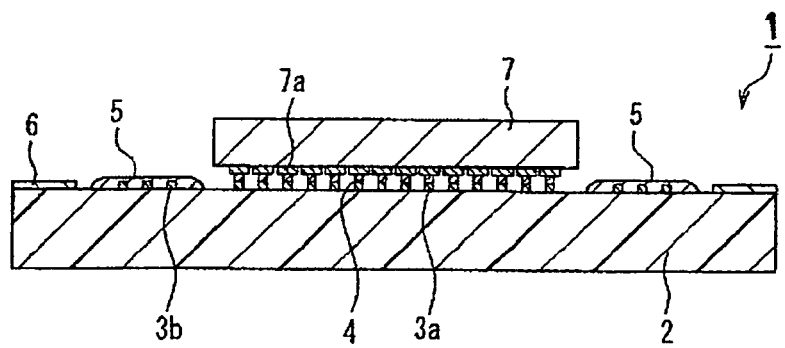
FIG. 14 is a sectional view showing a semiconductor device in which the conventional wiring board is used.
Figure 15:
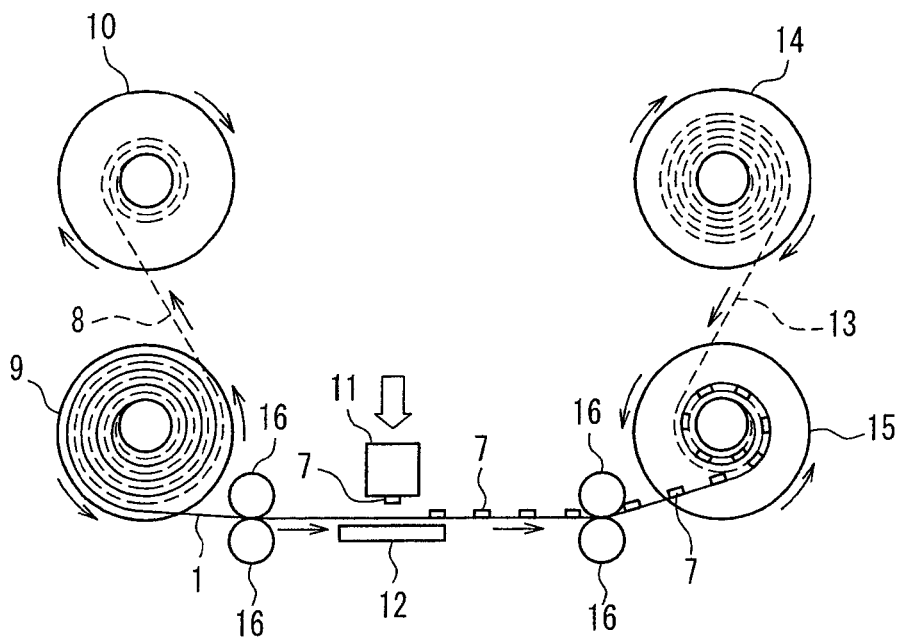
FIG. 15 is a side view for illustrating a method for manufacturing the semiconductor device in which the conventional wiring board is used.
Figure 16:
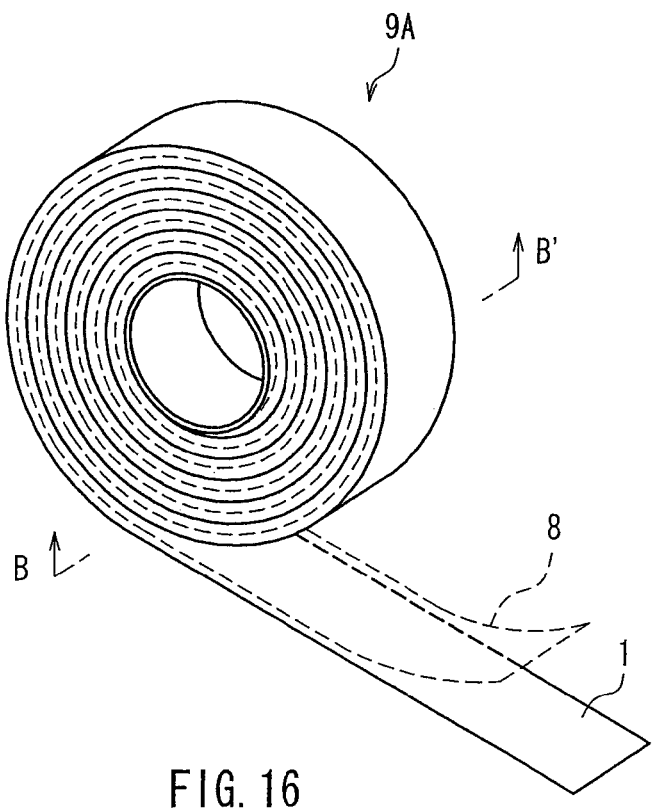
FIG. 16 is a perspective view showing a wiring board-winding body obtained by winding the conventional wiring board.
Figure 17:
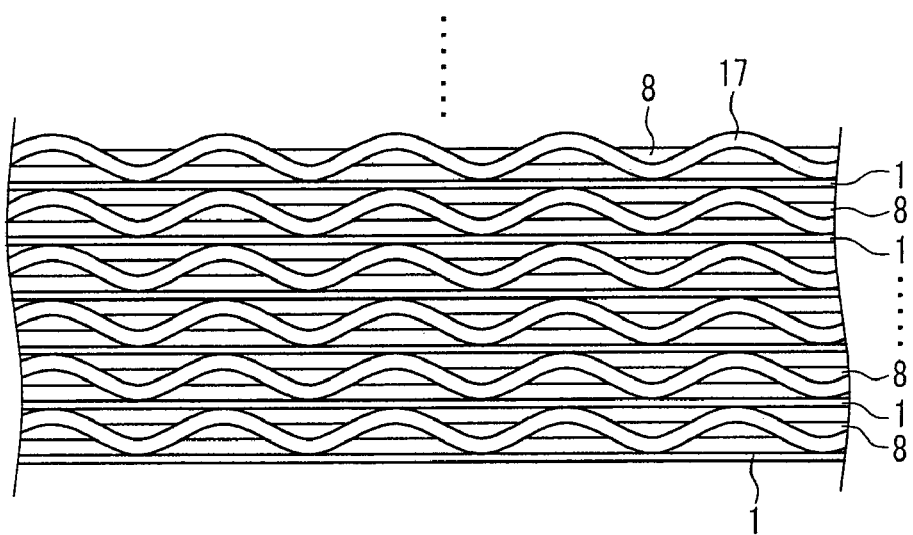
FIG. 17 is a side view showing a portion of a side surface of the wiring board-winding body.
Figure 18:
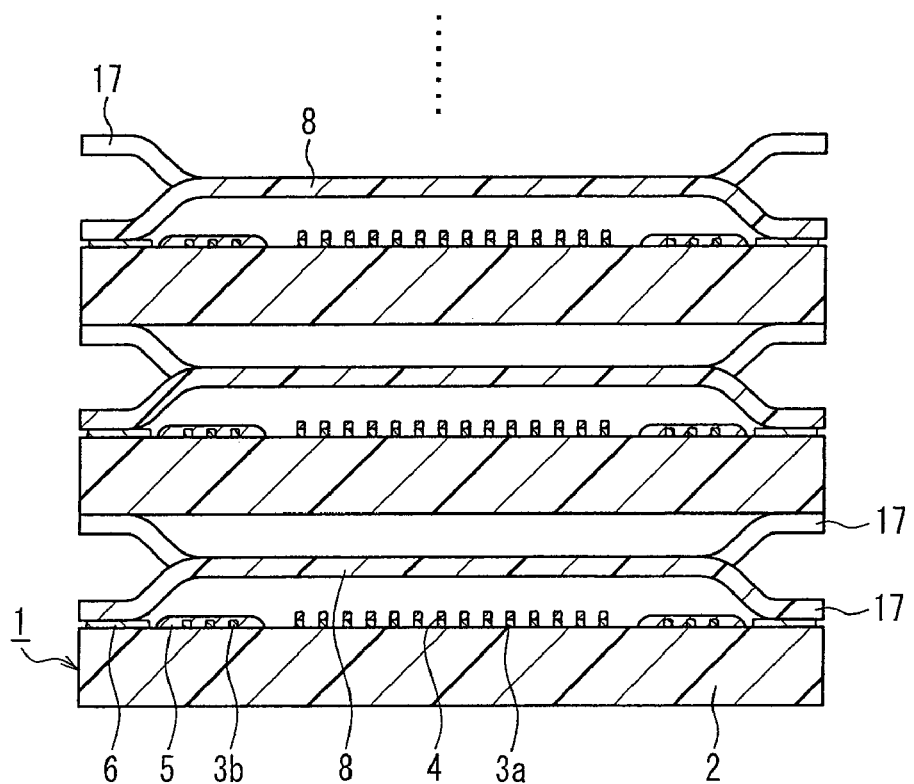
FIG. 18 is a sectional view showing the cross section of the wiring board-winding body taken along the line B-B' in FIG. 16.
Figure 19:
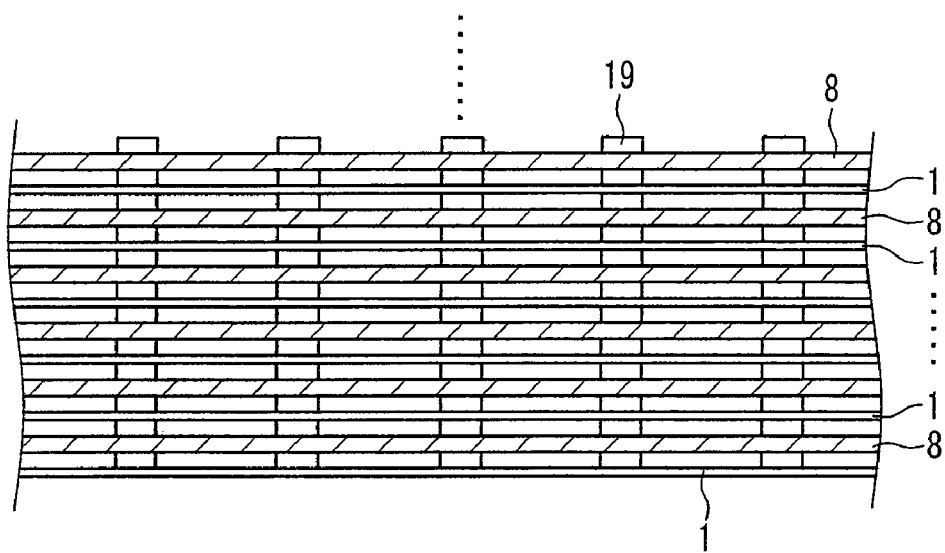
FIG. 19 is a side view showing the state where another conventional wiring board and a protective tape are layered alternately.
Figure 20:
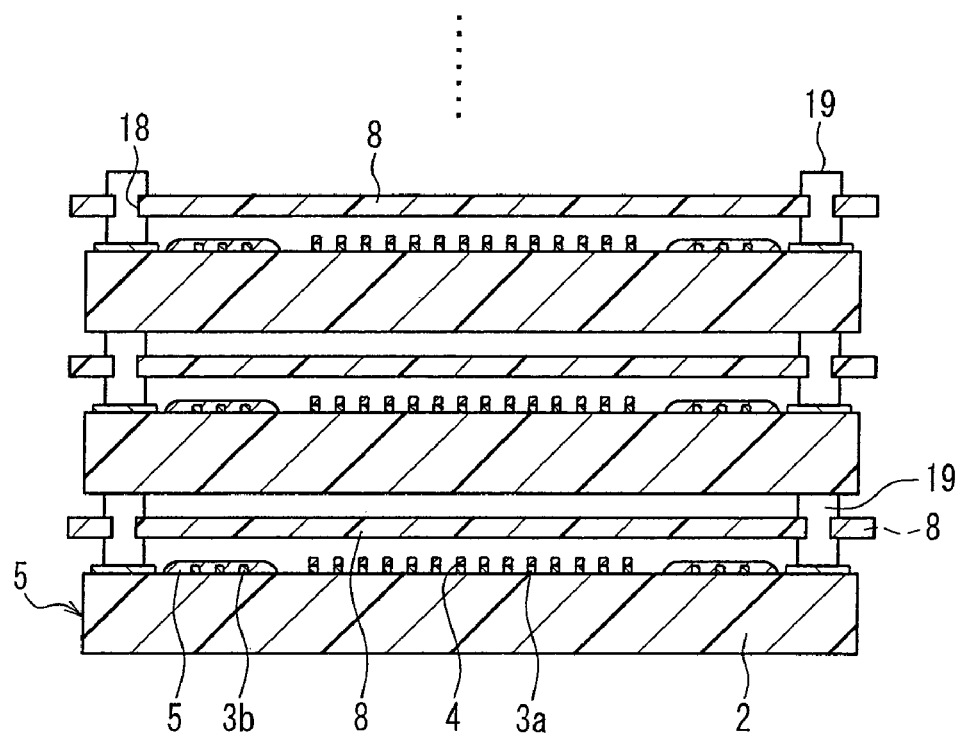
FIG. 20 is a sectional view showing the state where the another wiring board and the protective tape are layered alternately.

The basic structure of the wiring board 21a is the same as that of the conventional wiring board shown in FIGS. 12 and 13. First conductor wirings 23a are formed on a surface of an inner region of an insulating base 22, and a bump 24 is formed on an end portion of each of the first conductor wirings 23a. In regions on both sides of the first conductor wirings 23a, dummy conductor wirings 23b, each having the same structure as the first conductor wiring 23a, are provided. The bumps 24 are not formed on the dummy conductor wirings 23b. A protective film 25a for covering the first conductor wirings 23a is formed so that it has an opening at a portion corresponding to the central region of the insulating base 22 where the bumps 24 are provided, thereby exposing the bumps 24. The protective film 25a also covers the dummy conductor wirings 23b. Second conductor wirings 26 are formed along both side edges of the insulating base 22.

In the present embodiment, the shape of the protective film 25a is different from that in the conventional wiring board. Specifically, the protective film 25a is formed so that the height d2 (see FIG. 2) of its surface from the surface of the insulating base 22 is greater than the height d1 of the bumps 24 from the surface of the insulating base 22 (d2>d1).

As in the above-described conventional wiring board, a flexible tape formed of PI or the like and having a thickness of about 40 μm can be used as the insulating base 22, and the conductor wirings 23a can be formed of Cu so as to have a thickness of about 8 μm. The bumps 24 can be formed of Cu so as to have a thickness of about 10 μm.

The protective film 25a can be formed using an epoxy resin or a PI resin. For example, since d1=18 μm when the first conductor wirings 23a have a thickness of 8 μm and the bumps 24 have a thickness of 10 μm as described above, the protective film 25a is formed so that d2 would be about 30 μm.

In general, the surfaces of the bumps 24 are coated with about 0.1 to 1 μm thick plating of Au, Sn, or the like for bonding and protection against corrosion.

Figure 3:
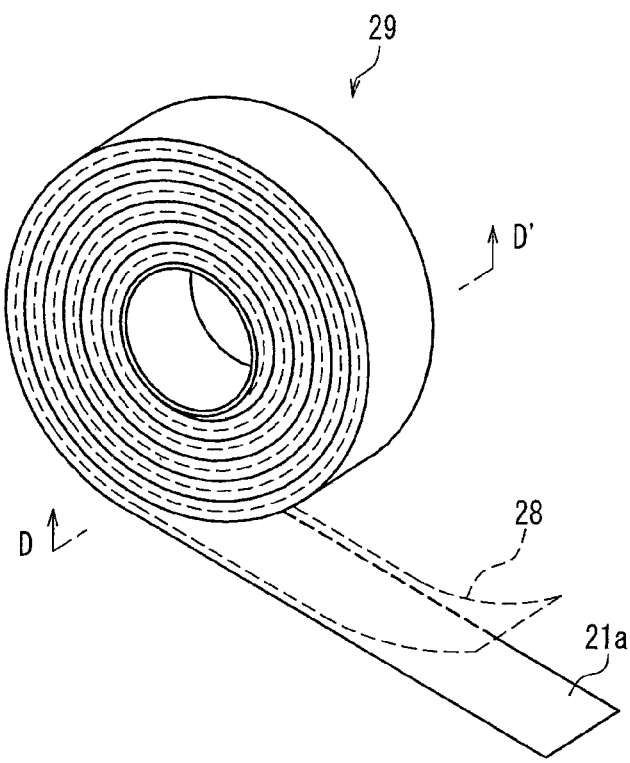
FIG. 3 is a perspective view showing a wiring board-winding body according to a fourth embodiment, which is obtained by winding the wiring board.
Figure 4:
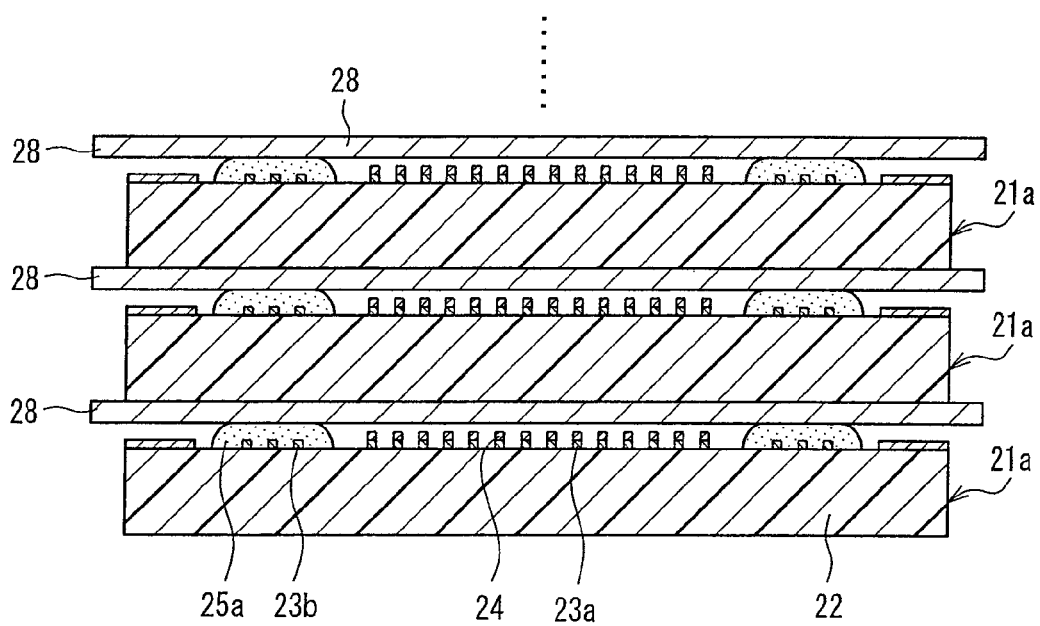
FIG. 4 is a sectional view showing the cross section of the wiring board-winding body taken along the line D-D' in FIG. 3.

FIG. 3 is a perspective view schematically showing a winding body obtained by winding the wiring board 21a shown in FIGS. 1 and 2 around a reel for supplying it, and FIG. 4 is a sectional view taken along the line D-D' in FIG. 3.

In FIGS. 3 and 4, reference numeral 28 denotes a protective tape. The wiring board 21a and the protective tape 28 are wounded around the reel such that they are layered alternately to form a wiring board-winding body 29 that supplies the wiring board 21a in the manufacturing process according to the TAB method. The protective tape 28 does not have supporting portions like the embossed portions 17 or the spacers 19 provided in the conventional protective tape 8. Since the protective tape 28 needs to have flexibility and mechanical strength, a tape formed of a material such as PEI, PET, or PI and having a thickness of 125 to 250 μm can be used as the protective tape 28 as in the above-described conventional example.

As shown in FIG. 4, in the state where the protective tape 28 is placed on the wiring board 21a, the protective tape 28 is supported by the protective film 25a that is formed so as to be higher than the bumps 24. Thus, a space is formed between the bumps 24 and the protective tape 28, thus preventing contact between the bumps 24 and the protective tape 28.

As described above, according to the configuration of the present embodiment, when the protective tape 28 is placed on the wiring board 21a, the protective tape 28 is supported by the protective film 25a formed so as to be higher than the bumps 24. Accordingly, even if the protective tape 28 does not have supporting portions, the protective tape 28 does not contact the bumps 24. This prevents the bumps 24 from being damaged or contaminated.

SECOND EMBODIMENT

Figure 5:
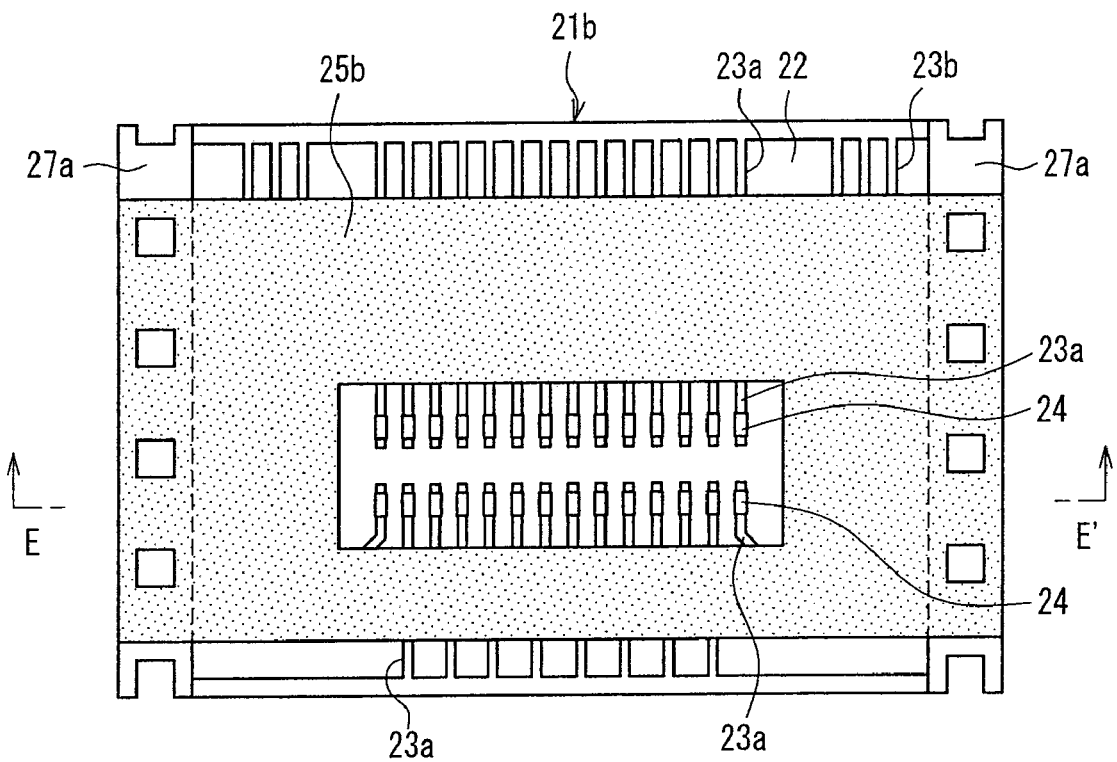
FIG. 5 is a plan view showing a wiring board according to a second embodiment of the present invention.
Figure 6:
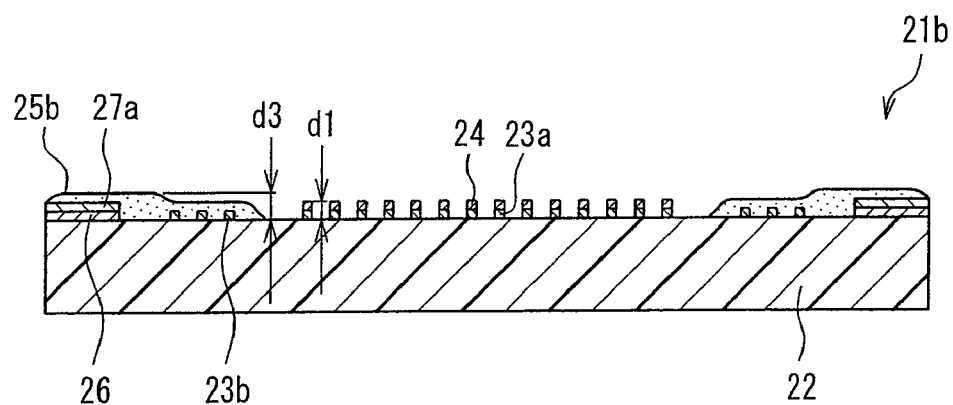
FIG. 6 is a sectional view showing the cross section of the wiring board taken along the line E-E' in FIG. 5.

FIG. 5 is a plan view showing a wiring board 21b according to a second embodiment of the present invention, and FIG. 6 is a sectional view taken along the line E-E' in FIG. 5. In the present embodiment, the same elements as those of the wiring board 21a of the first Embodiment are given the same reference numerals and the descriptions thereof will not be repeated.

The wiring board 21b according to the present embodiment is different from the wiring board 21a according to the first embodiment in that supporting portions 27a are formed on second conductor wirings 26 formed on respective side edge portions of an insulating base 22. Furthermore, a protective film 25b is formed such that it covers the surfaces of first conductor wirings 23a, dummy conductor wirings 23b, and the supporting portions 27a and exposes bumps 24 through an opening provided at a region around the bumps 24. The height d3 (see FIG. 6) of a surface of the protective film 25b on each of the supporting portions 27a from the surface of the insulating base 22 is greater than the height d1 of the bumps 24 from the surface of the insulating base 22 by the thickness of the protective film 25b.

As in the first embodiment, a flexible tape formed of PI or the like and having a thickness of about 40 μm can be used as the insulating base 22, and the first conductor wirings 23a and the second conductor wirings 26 can be formed of Cu so as to have a thickness of about 8 μm. The bumps 24 and the supporting portions 27a can be formed of Cu so as to have a thickness of about 10 μm.

The protective film 25b can be formed using an epoxy resin or a PI resin. For example, when the first conductor wiring 23a and the second conductor wiring 26 have a thickness of 8 μm and the bumps 24 and the supporting portions 27a have a thickness of 10 μm as described above, by forming the protective film 25b so that the thickness of the protective film 25b on each of the protruding supporting portions 27a is about 10 μm, d3=28 μm and d1=18 μm so that d3>d1 is satisfied.

In general, the surfaces of the bumps 24 are coated with about 0.1 to 1 μm thick plating of Au, Sn, or the like for bonding and protection against corrosion.

As described above, according to the configuration of the present embodiment, when the protective tape is placed on the wiring board 21b, the protective tape is supported by the protective film 25b formed so as to be higher than the bumps 24, so that, even if the protective tape does not have supporting portions, the protective tape does not contact the bumps 24 as in the first embodiment. This prevents the bumps 24 from being damaged or contaminated.

Moreover, since the protective film 25b is formed on the supporting portions 27a, it is possible to secure a height sufficient for supporting the protective tape even when the thickness of the protective film 25b is small and to reduce the amount of the material of the protective film 25b to be used.

THIRD EMBODIMENT

Figure 7:
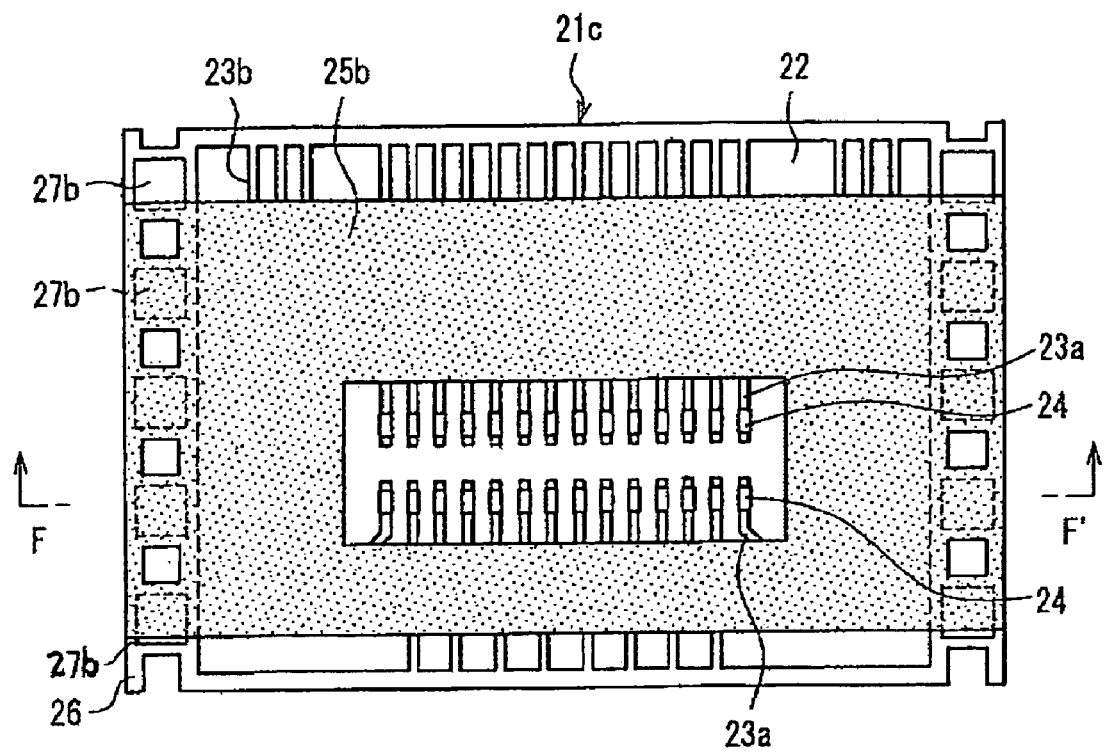
FIG. 7 is a plan view showing a wiring board according to a third embodiment of the present invention.
Figure 8:
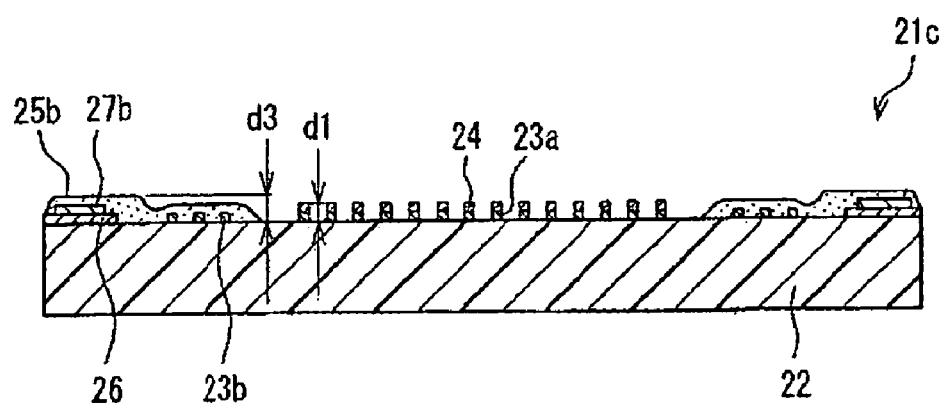
FIG. 8 is a sectional view showing the cross section of the wiring board taken along the line F-F' in FIG. 7.

FIG. 7 is a plan view showing a wiring board 21c according to a third embodiment of the present invention, and FIG. 8 is a sectional view taken along the line F-F' in FIG. 7. In the present embodiment, the same elements as those of the wiring board 21b of the second embodiment are given the same reference numerals and the descriptions thereof will not be repeated.

The wiring board 21c according to the present embodiment is different from the wiring board 21b according to the second embodiment in that each of the supporting portions 27b is composed of a plurality of regions formed on the second conductor wiring 26. The supporting portions 27b have the same thickness as the bumps 24, and each of the regions composing the supporting portion 27b has a rectangular planar shape with a size of about 2 mm×2 mm, for example.

With the configuration according to the present embodiment, the same effect as in the first and second embodiments can be obtained. In addition, since the supporting portions 27b, each composed of a plurality of protruding regions, are provided on the respective second conductor wirings 26, the wiring board 21c can achieve improve flexibility as compared with the configuration according to the second embodiment. This is advantageous in that the feeding of the wiring board 21c can be controlled easily when assembling a semiconductor device according to the TAB method.

FOURTH EMBODIMENT

A fourth embodiment of the present invention is directed to a wiring board-winding body obtained by winding a wiring board with a protective tape being placed thereon. One example of the wiring board-winding body according to the present embodiment has a configuration as shown in FIGS. 3 and 4, which already has been described above. That is, the wiring board-winding body is obtained by winding the wiring board 21a shown in FIGS. 1 and 2 around a reel (not shown) for supplying it with the protective tape 28 being placed on the wiring board 21a.

As shown in FIG. 4, in the wiring board-winding body 29 according to the present embodiment, the protective tape 28 is placed so as to be in contact with the protective film 25a formed on the surface of the wiring board 21a at portions of the protective film 25a where the height from the insulating base 22 is greatest. Therefore, the wiring board 21a and the protective tape 28 are layered alternately with the rear surface of the protective tape 28 not contacting the bumps 24.

With such a configuration of the wiring board-winding body, the wiring board 21a and the protective tapes 28 can be layered alternately with the protective tape 28 being in direct contact with the surface of the protective film 25a. This brings about an advantage in that, as compared with the conventional wiring board-winding body in which the wiring board and the protective tape having supporting portions in its respective end portions are layered alternately, a larger number of layers of the wiring board 21a can be contained in the winding body of the same height.

The same advantage can be obtained when the wiring board-winding body is formed by winding the wiring board 21b or 21c according to the second or third embodiment with the protective tape 28 being placed thereon.

FIFTH EMBODIMENT

Figure 9A:
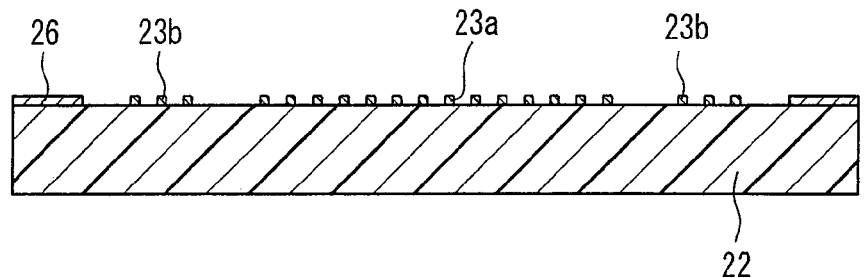
FIGS. 9A to 9C are sectional views illustrating major steps in a wiring board manufacturing method according to a fifth embodiment of the present invention.
Figure 9B:
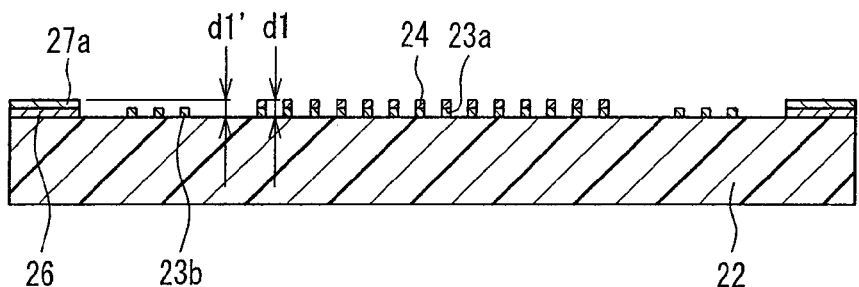
Figure 9C:
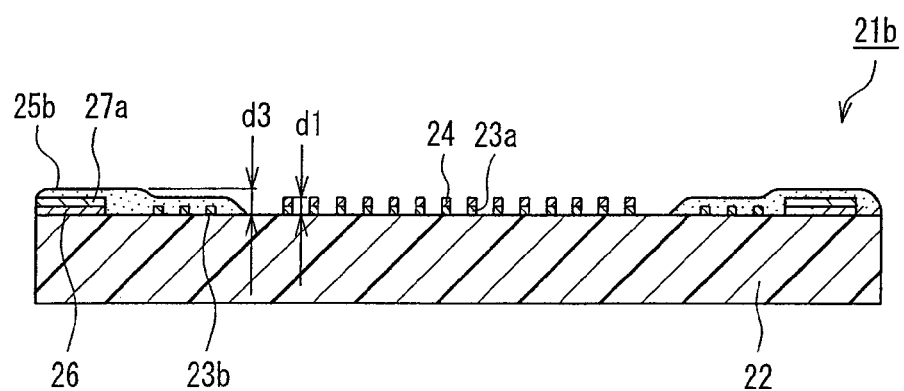

A wiring board manufacturing method according to a fifth embodiment of the present invention will be described with reference to the drawings. FIGS. 9A to 9C shows major steps of manufacturing the wiring board 21b shown in FIGS. 5 and 6 in the order of performing these steps. In the present embodiment, the same elements as those of the wiring board 21b shown in FIGS. 5 and 6 are given the same reference numerals and the descriptions thereof will not be repeated.

First, as shown in FIG. 9A, first conductor wirings 23a, dummy conductor wirings 23b, and second conductor wirings 26 are formed on an insulating base 22. As the insulating base 22, a flexible tape formed of PI or the like and having a thickness of about 40 µm is used. The first conductor wirings 23a, the dummy conductor wirings 23b, and the second conductor wirings 26 are formed by etching an about 8 µm thick Cu foil into a desired pattern.

Next, a resist film (not shown) is applied on the first conductor wirings 23a, the dummy conductor wirings 23b, and the second conductor wirings 26. Then, the resist film is exposed and developed to provide openings with a desired pattern. Portions exposed through the openings are plated with Cu by electroplating, whereby bumps 24 and supporting portions 27a are formed at the same time as shown in FIG. 9B. In the case of electroplating, the height d1 of the bumps 24 and the height d1' of the supporting portions 27a can be made equal (d1=d1') by performing the electroplating for the same period of time. For example, the bumps 24 and the supporting portions 27a are formed so that both d1 and d1' would be about 10 µm (d1=d1'≈10 µm).

Next, as shown in FIG. 9C, an epoxy resin or a PI resin is pattern-printed and then cured, thereby forming a protective film 25b that covers the first conductor wirings 23a, the dummy conductor wirings 23b, the second conductor wirings 26, and the protruding supporting portions 27a and has an opening at a region around the bumps 24. Since the height d1 of the bumps 24 is equal to the height d1' of the supporting portions 27a, the height d3 of the surface of the protective film 25b formed on each of the supporting portions 27a is greater than the height d1 of the bumps 24 by the thickness of the protective film 25b, as shown in FIG. 9C.

For example, when the first conductor wirings 23a and the second conductor wirings 26 have a thickness of 8 µm and the bumps 24 and the supporting portions 27a have a thickness of 10 µm as described above, d1=18 µm is satisfied. By forming the protective film 25b so that the thickness of the protective film 25b on each of the protruding supporting portions 27a is about 10 µm, d3 is 28 µm, so that d3>d1 is satisfied because d3 is greater than d1 by the thickness of the protective film 25b on each of the supporting portions 27a.

As described above, according to the wiring board manufacturing method of the present embodiment, the bumps 24 on the first conductor wirings 23a and the protruding supporting portions 27a on the second conductor wirings 26 are formed at the same time by electroplating, so that the height (d1) of the bumps 24 and the height (d1') of the protruding supporting portions 27a are made equal. This brings about an advantage in that the height (d3) of the surface of the protective film 25b formed on each of the protruding supporting portions 27a from the surface of the insulating base 22 always can be made greater than the height (d1) of the bumps 24 from the surface of the insulating base 22 by the thickness of the protective film 25b.

Figure 10:
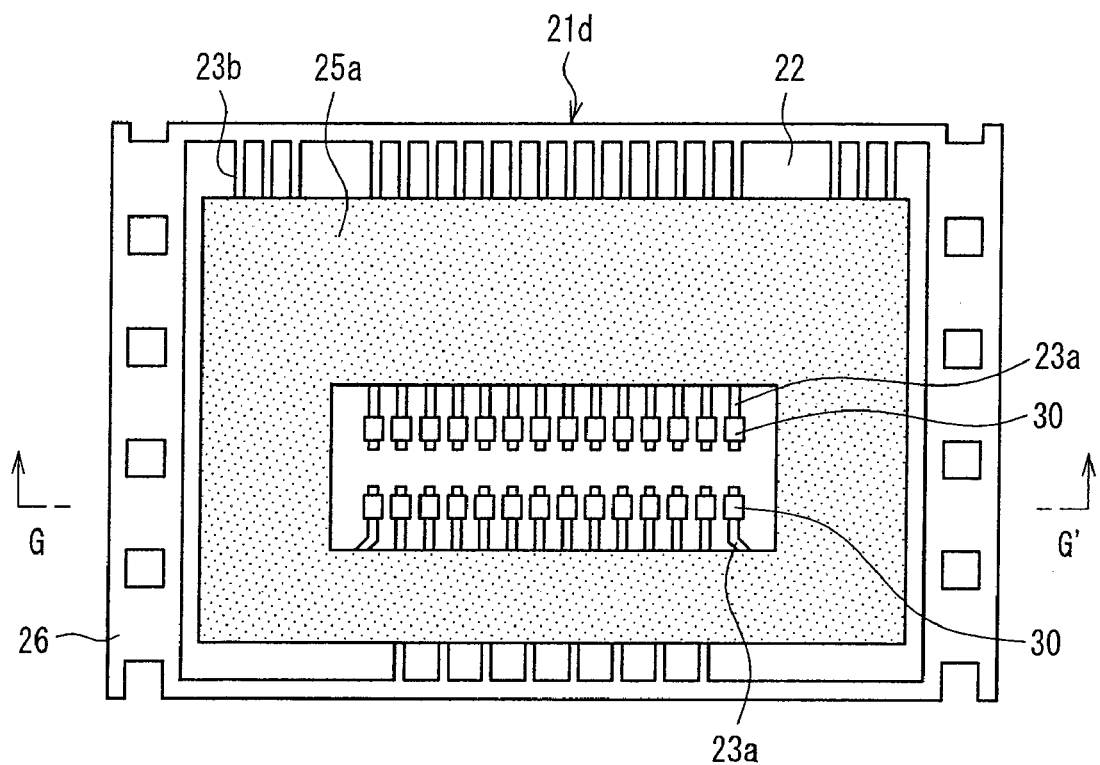
FIG. 10 is a plan view showing a wiring board according to another aspect of the first embodiment of the present invention.
Figure 11:
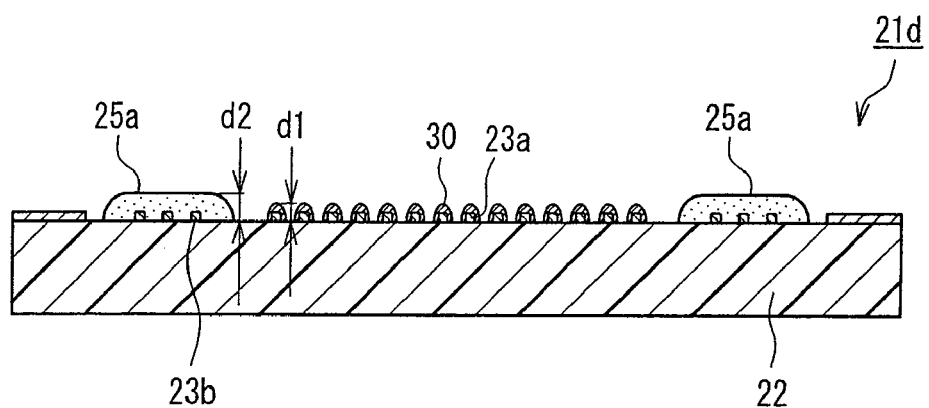
FIG. 11 is a sectional view showing the cross section of the wiring board taken along the line G-G' in FIG. 10.

Although the above-described respective embodiments are directed to the case where the bumps 24 are formed on the first conductor wirings 23a as shown in, e.g., FIGS. 1 and 2, it is also possible to form bumps 30 as in a wiring board 21d shown in FIGS. 10 and 11. More specifically, each of the bumps 30 is provided across the longitudinal direction of the corresponding one of first conductor wirings 23a so as to extend over regions of an insulating base 22 on both sides of the first conductor wiring 23a. The cross sectional shape of the bump 30 taken in the width direction of the first conductor wiring 23a is such that a central portion is higher than portions on both sides of the central portion. With this configuration, the same effect as in the above-described respective embodiments also can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board comprising:
   an insulating base;
   a plurality of first conductor wirings aligned in an inner region on the insulating base;
   second conductor wirings formed on respective side edge portions of the insulating base;
   bumps formed on the respective first conductor wirings;
   wherein said forming the concave surface includes joining a stiffener onto a device mounting surface of said organic resin substrate to form a multiple-layered member, and forming said concave surface in said multiple-layered member
   a protective film that is formed on the insulating base so as to cover the first conductor wirings and the second conductor wirings and has an opening region through which the bumps are exposed; and
   a protecting sheet being placed on the wiring board,
   wherein a rear surface of the protecting sheet is in contact with the protective film, the protecting sheet covering the bumps, and
   a height of the rear surface of the protecting sheet from a surface of the insulating base is greater than a height of the bumps from the surface of the insulating base.

2. The wiring board according to claim 1, further comprising:
supporting portions formed on the respective second conductor wirings,
wherein a height of at least part of a surface of the protective film on each of the supporting portions from the surface of the insulating base is greater than the height of the bumps from the surface of the insulating base.

3. The wiring board according to claim 2, wherein the supporting portions are formed of the same material as the bumps.

4. The wiring board according to claim 2, wherein each of the supporting portions is composed of a plurality of regions that are separated from each other in a longitudinal direction of the second conductor wiring.

5. A semiconductor device comprising:
the wiring board according to claim 1; and
a semiconductor chip mounted on the wiring board, wherein electrode pads of the semiconductor chip are connected electrically to the conductor wirings.

6. The wiring board according to claim 1, wherein the protective film is a single layer.

* * * * *